United States Patent
Mak et al.

(10) Patent No.: US 7,948,309 B2
(45) Date of Patent: May 24, 2011

(54) DC-OFFSET CANCELLED PROGRAMMABLE GAIN ARRAY FOR LOW-VOLTAGE WIRELESS LAN SYSTEM AND METHOD USING THE SAME

(75) Inventors: Pui-In Mak, Macau (CN); Seng-Pan U, Macau (CN); Rui P. Martins, Macau (CN)

(73) Assignee: University of Macau, Taipu, Macau ( * ) Notice: Subject to any disclaimer, the term of this patent is extended or adjusted under 35 U.S.C. 154(b) by 0 days.

(21) Appl. No.: 12/355,658

(22) Filed: Jan. 16, 2009

(65) Prior Publication Data
US 2010/0182080 A1    Jul. 22, 2010

(51) Int. Cl.
 *H03F 3/68* (2006.01)
 *H03F 1/36* (2006.01)
(52) U.S. Cl. .......................................... 330/98; 330/107
(58) Field of Classification Search .................... 330/98, 330/99, 100, 107, 109, 292; 455/253.2
See application file for complete search history.

(56) References Cited

U.S. PATENT DOCUMENTS

| | | | | |
|---|---|---|---|---|
| 5,373,248 A | * | 12/1994 | Fernandez | 330/253 |
| 5,392,000 A | * | 2/1995 | Gillig | 330/107 |
| 5,923,216 A | * | 7/1999 | Pennock | 330/255 |
| 7,355,471 B2 | * | 4/2008 | Chen et al. | 330/9 |
| 7,652,531 B2 | * | 1/2010 | Wang et al. | 330/99 |
| 2007/0066254 A1 | * | 3/2007 | Tsuchie et al. | 455/183.2 |

* cited by examiner

*Primary Examiner* — Steven J Mottola
(74) *Attorney, Agent, or Firm* — Osha • Liang LLP

(57) ABSTRACT

An amplifier circuit includes a transconductance amplifier at an input side of the amplifier circuit, a transimpedance amplifier connected to an output of the transconductance amplifier, and a voltage amplifier connected to an output of the transimpedance amplifier. The transconductance amplifier and the transimpedance amplifier form a low-impedance node at an interface thereof. A feedback circuit is connected between an output of the voltage amplifier and the low-impedance node between the transconductance amplifier and the transimpedance amplifier. The transconductance amplifier, the transimpedance amplifier, and the voltage amplifier form a main amplifier stage. The feedback circuit senses an imbalance in an output of the main amplifier stage, whereby a correction signal is integrated and negatively fed back to the low-impedance node between the transconductance amplifier and the transimpedance amplifier.

27 Claims, 7 Drawing Sheets

DC-OFFSET CANCELLED PROGRAMMABLE GAIN ARRAY FOR LOW-VOLTAGE WIRELESS LAN SYSTEM AND METHOD USING THE SAME

BACKGROUND OF INVENTION

1. Field of the Invention

The present invention relates generally to a dc-offset cancelled programmable gain array (PGA) for wireless local area network (WLAN) applications. More specifically, embodiments of the present invention relate to an amplifier circuit with DC-offset cancellation, where a high-pass pole with a large time constant may be switched to a lower or higher frequency.

2. Background Art

The rapid evolution of CMOS technology has accelerated the integration of mixed-signal systems, such as the wireless transceiver on a single chip. In the case of a zero intermediate-frequency (IF) or low IF receiver architecture targeted toward IEEE 802.11 a/b/g WLAN applications, signal levels arriving at the baseband are scaled to around a 0 dBm range for analog-to-digital conversion. FIG. 1 shows a block diagram for a receiver 100 in a dual-receive conversion configuration. The receiver 100 may include a Radio-Frequency (RF) input 105, a Low Noise Amplifier (LNA) 110 followed by a mixer 115 with a Local Oscillator Reference Frequency ($LO_{RF}$) 117, also in the RF range. Due to the difference between the "in-phase" I and the "quadrature" Q signals, mixers 120 and 125 may have different IF reference frequencies ($LO_{IF}(I)$ 122 and $LO_{IF}(Q)$ 127). Baseband channel selection filters 130 and 135 and PGAs 140 and 145 complete the typical low IF receiver block diagram. PGAs 140 and 145 are inverting amplifiers that include a switched-resistor bank for gain control. Terminals 150 and 155 constitute the output. A single synthesizer may synthesize both the IF and the $LO_{RF}$ frequencies.

The dynamic-range requirement from the antenna (input terminal 105) to the baseband may approximately equal 0 to 80 dB, with the majority of the gain achieved in the baseband. If the radio front-end offers a 0 to 30 dB gain range, the baseband channel selection filters 130 and 135 and PGAs 140 and 145 have to provide another 0 to 50 dB of controllable gain. With technology scaling, capacitive coupling in a zero IF receiver would increase enough to contribute to the dc-offset problem. The dc-offset may easily saturate the PGA due to a large cascaded gain. For example, in a zero IF receiver, the composite high-pass pole must be around tens of kilohertz (kHz) in order to prevent deep signal damage. The large time constant of such a composite high-pass pole requires a circuit with a large chip-area and an appropriate circuitry to overcome the long dc-offset transient induced in the gain change. This is particularly crucial for IEEE 802.11a and 802.11g applications, where the short preamble for gain settling time is just 8 μs.

SUMMARY OF INVENTION

According to one aspect of one or more embodiments of the present invention, an amplifier circuit includes a transconductance amplifier at an input side of the amplifier circuit, a transimpedance amplifier connected to an output of the transconductance amplifier, and a voltage amplifier connected to an output of the transimpedance amplifier. The transconductance amplifier and the transimpedance amplifier form a low-impedance node at an interface thereof. A feedback circuit is connected between an output of the voltage amplifier and the low-impedance node between the transconductance amplifier and the transimpedance amplifier. The transconductance amplifier, the transimpedance amplifier, and the voltage amplifier form a main amplifier stage. The feedback circuit senses an imbalance in an output of the main amplifier stage, whereby a correction signal is integrated and negatively fed back to the low-impedance node between the transconductance amplifier and the transimpedance amplifier.

According to one aspect of one or more embodiments of the present invention, a receiver for use in wireless local area networks includes a low noise amplifier, a first mixer with a first local oscillator reference frequency in an RF range, a second mixer with a second local oscillator reference frequency in an IF range, a channel selection filter, and a PGA. The PGA circuit includes a transconductance amplifier at an input side thereof, a transimpedance amplifier connected to an output of the transconductance amplifier, and a voltage amplifier connected to an output of the transimpedance amplifier. The transconductance amplifier and the transimpedance amplifier form a low-impedance node at an interface thereof. A feedback circuit is connected between an output of the voltage amplifier and the low-impedance node between the transconductance amplifier and the transimpedance amplifier. The transconductance amplifier, the transimpedance amplifier, and the voltage amplifier form a main amplifier stage. The feedback circuit senses an imbalance in an output of the main amplifier stage, whereby a correction signal is integrated and negatively fed back to the low-impedance node between the transconductance amplifier and the transimpedance amplifier.

According to one aspect of one or more embodiments of the present invention, a method for shifting a high-pass pole to a lower or higher frequency in a PGA includes connecting an output of a transconductance amplifier to an input of a transimpedance amplifier to form a low-impedance node at an interface thereof, connecting a voltage amplifier to an output of the transimpedance amplifier, connecting a feedback circuit between an output of the voltage amplifier and the low-impedance node between the transconductance amplifier and the transimpedance amplifier. With the transconductance amplifier, the transimpedance amplifier, and the voltage amplifier forming a main amplifier stage, the method also includes sensing an imbalance in an output of the main amplifier stage, whereby a correction signal is integrated and negatively fed back to the low-impedance node between the transconductance amplifier and the transimpedance amplifier.

Other aspects and advantages of the invention will be apparent from the following description and the appended claims.

DETAILED DESCRIPTION

Figure 1:
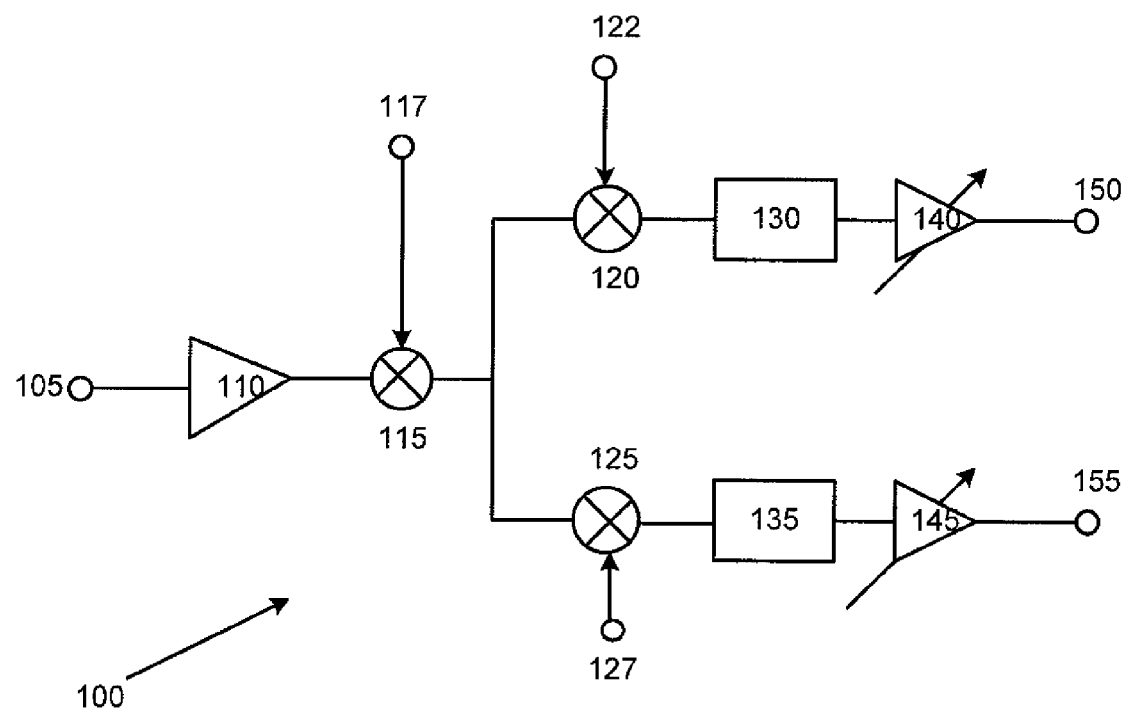
FIG. 1 shows a block diagram of a receiver in accordance with one or more embodiments of the present invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of the present invention generally relate to an inside-opamp DOC technique and a circuit using the same that shifts high-pass poles with large time constants to lower or higher frequencies. In one or more embodiments of the present invention, a large time-constant integrator around the PGA eliminates the dc-offset and provides for pole switchability to shorten the receiver setting time in case of dc-offset transients. In one or more embodiments of the present invention, an integrator is embedded inside an opamp to sense the imbalance of the differential outputs thereof. In one or more embodiments of the present invention, the integrated correction signal is converted into current and negatively fed back to the opamp at an inherent low-impedance node.

Figure 2:
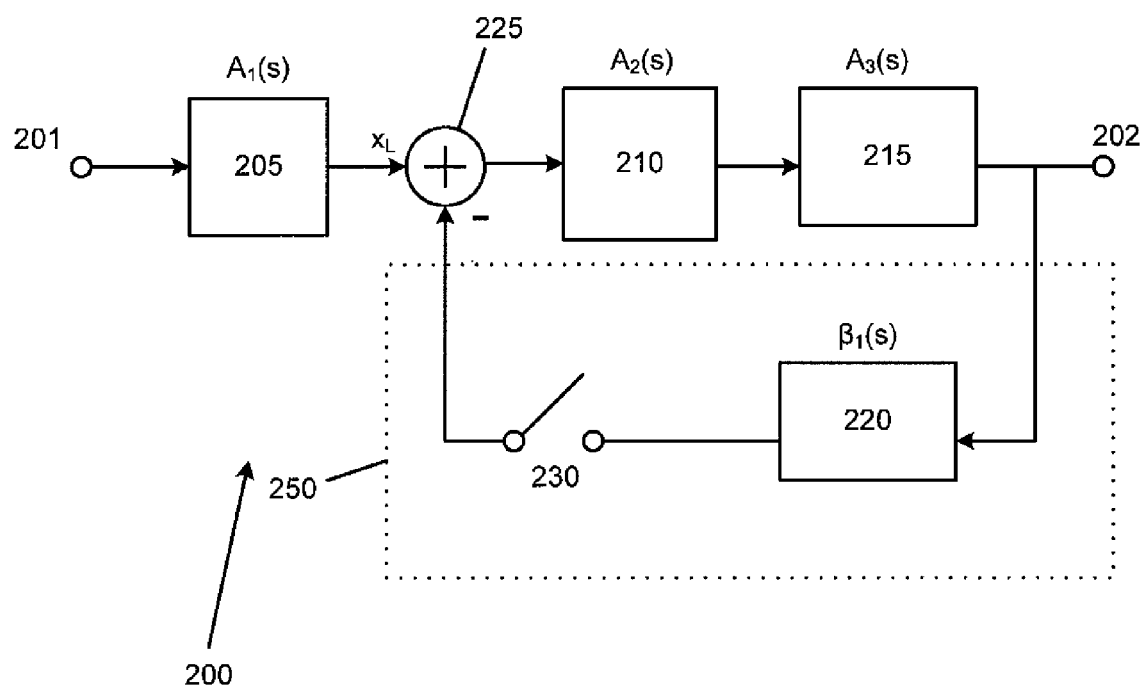
FIG. 2 shows the block diagram of an inside-opamp dc-offset canceller (DOC) in accordance with one or more embodiments of the present invention.

FIG. 2 shows the block diagram of an inside-opamp DOC 200 in accordance with one or more embodiments of the present invention. The set-up may be described using the inherent signal-conversion characteristic (voltage V and current I) of a two-stage opamp $A_{OL}(s)$. In one or more embodiments, the inside-opamp DOC 200 may be divided into three sub-circuits, $A_1(s)$ 205, $A_2(s)$ 210, and $A_3(s)$ 215, representing a transconductance, a transimpedance, and a voltage amplifier, respectively. Input $x_v$ 201 is the input at the transconductance amplifier, and output $x_0$ 202 is the output of the inside-opamp DOC 200 system. In one or more embodiments, $A_1(s)$ 205 and $A_2(s)$ 210 may constitute a gain stage and create an inherent low-impedance node $x_L$ 225 at an interface thereof, due to mismatch between the transconductance and transimpedance stage. This mismatch may influence an increase in bandwidth. In one or more embodiments, closing the primary feedback loop around $A_2(s)$ 210 and $A_3(s)$ 215 creates a DOC opamp $A_{OL,OC}(s)$ while minimizing the loading effects between $A_1(s)$ 205, $A_2(s)$ 210, and the feedback circuit $\beta_1(s)$ 220. In one or more embodiments, the linear sum of multiple current signals may be permitted by the aforementioned low-impedance node $x_L$ 225. In one or more embodiments, realizing $\beta_1(s)$ 220 as a transconductance integrator may directly comply with the opamp internal signal conversion and create a unilateral low-frequency path from output $x_0$ 202 to low-impedance node $x_L$ 225. The feedback loop 250 may include a switch 230 that may be turned ON or OFF appropriately. The two-stage opamp in accordance with one or more of the abovementioned embodiments may be expressed as example Equation (1).

$$A_{OL}(s) = A_1(s) \cdot A_2(s) \cdot A_3(s) \tag{1}$$

In one or more embodiments, the DOC opamp $A_{OL,OC}(s)$ may be expressed as example Equation (2):

$$\frac{x_0}{x_v} = A_{OL,OC}(s) = \frac{A_1(s) \cdot A_2(s) \cdot A_3(s)}{1 + A_2(s) \cdot A_3(s) \cdot \beta_1(s)} \tag{2}$$

Figure 3:
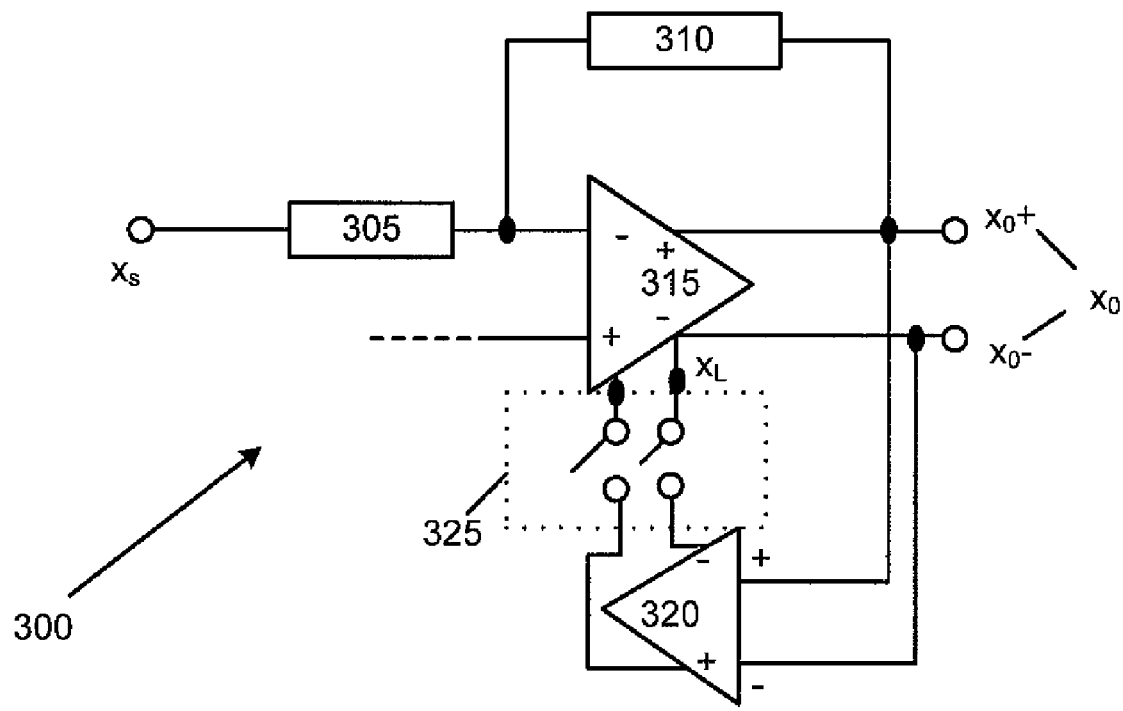
FIG. 3 shows a circuit that includes an inverting amplifier, with a DOC feedback applied at $x_L$ of FIG. 1, in accordance with one or more embodiments of the present invention.

FIG. 3 shows a circuit 300 that includes an inverting amplifier $A_{OL}(s)$ 315, with a DOC feedback applied at $x_L$ of FIG. 1, in accordance with one or more embodiments of the present invention. Input $x_s$ is the input of the circuit 300, and output $x_0$ ($x_{0+}$ and $x_{0-}$) is the output of the circuit 300. In one or more embodiments, the circuit may include highly linear passive component resistors as part of the forward resistor $R_{ff}$ 305 and the feedback resistor $R_{fb}$ 310. In one or more embodiments, the feedback circuit $\beta_1(s)$ 320 may reside on the forward path closed by the feedback resistor $R_{fb}$ 310 that creates another loop gain. Consequently, the input-referred noise of the feedback circuit $\beta_1(s)$ 320 may be divided by that of the preceding stage of $A_{OL}(s)$ 315, i.e., the wideband transconductance amplifier $A_1(s)$ (see FIG. 2). The feedback circuit $\beta_1(s)$ 320 may be controlled by switches 325 to control ON and OFF times thereof. In one or more embodiments, the nonlinearity of the feedback circuit $\beta_1(s)$ 320 may be suppressed by the opamp feedback resistor $R_{fb}$ 310 created loop gain, which may be made stable by employing a switched resistor array (not shown in FIG. 3) in parallel with the feedback resistor $R_{fb}$ 310, and tuning the gain range.

In one or more embodiments, the feedback factor, $\beta_{IA}$, of the circuit 300 of FIG. 3 may be expressed as example Equation (3):

$$\beta_{IA} = \frac{R_{ff}}{R_{fb} + R_{ff}} \tag{3}$$

In one or more embodiments, the closed-loop response $A_{CL,OC}(s)$ of the circuit 300 may be expressed as example Equation (4):

$$\frac{x_0}{x_s} = A_{CL,OC}(s) = \frac{-\frac{R_{fb}}{R_{ff}}}{1 + \frac{1}{A_{OL,OC}(s) \cdot \beta_{IA}}}, \tag{4}$$

where input $x_s$ the input of the circuit 300 and output $x_0$ is the output of the circuit 300.

Figure 4:
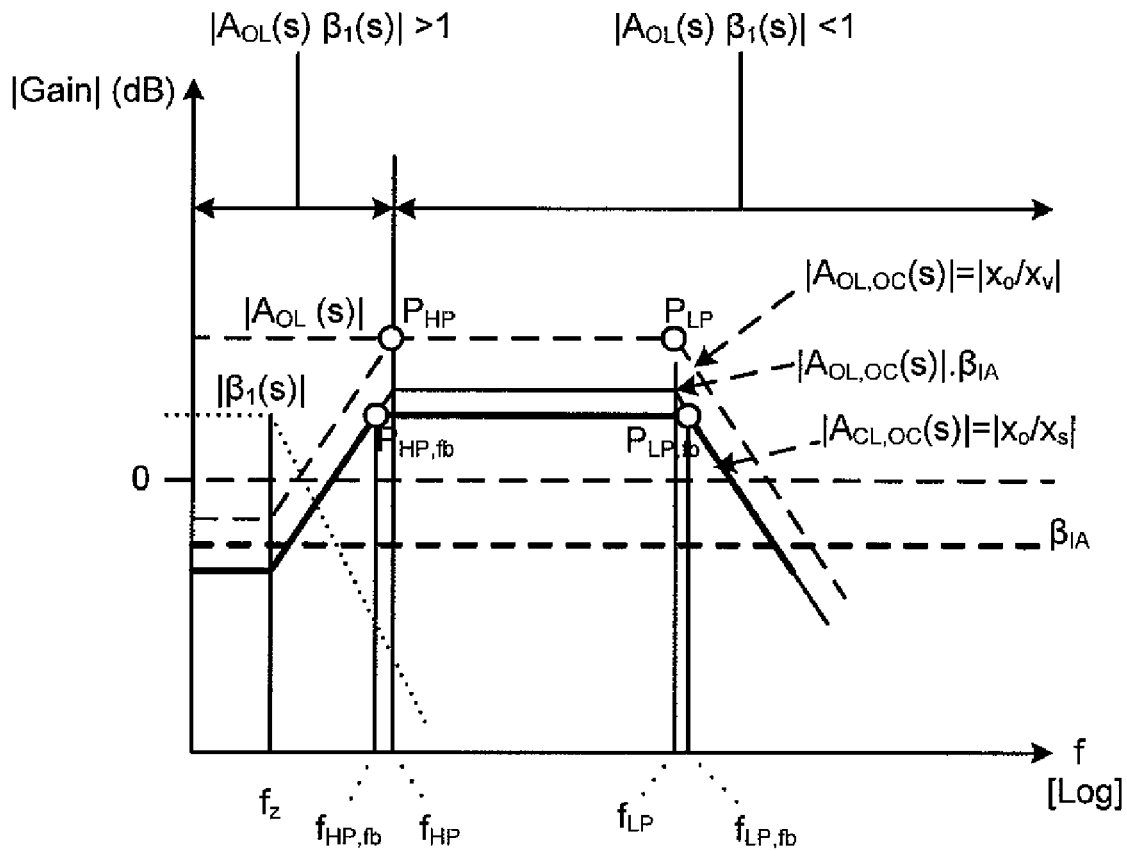
FIG. 4 shows the inverting amplifier with built-in DOC illustrated in the frequency domain (gain vs. log frequency) in accordance with one or more embodiments of the present invention.

FIG. 4 shows the inverting amplifier with a built-in DOC of FIGS. 2-3 illustrated in the frequency domain (gain vs. log frequency) in accordance with one or more embodiments of the present invention. The role of the negative feedback in bandwidth extension is shown by way of the high-pass (low-pass) pole being shifted to a lower (higher) frequency value by an amount of the loop gain, i.e., $f_{LP}$ to $f_{LP,fb}$ it for low-pass, pass, and $f_{HP}$ to $f_{HP,fb}$ for high-pass (see FIG. 4). This occurs because $f_{LP}$ and $f_{HP}$ in an open-loop configuration have an added factor when feedback is introduced. The zero-frequency gain also drops accordingly. In one or more embodiments, the DOC opamp, $A_{OL,OC}(s)$, used in closed-loop, may lower the high-pass pole with no area overhead, resulting in large chip area savings. In one or more embodiments, only one global DOC may be employed where the lower cutoff needs to be frequently adjusted once the forward path changes gain. In one or more embodiments, a detailed DOC may be embedded at each stage of the circuit. In this case, the cut-off frequency depends simply on the feedback factor of the closed-loop circuit. In one or more embodiments, the obtained rejection at dc may be expressed as example Equation (5):

$$\frac{|A_{CL,OC}(f_{HP,fb})|}{|A_{CL,OC}(f_z)|} \approx \left|\frac{\beta_1(f_z)}{A_1(f_z)}\right|\frac{1}{\beta_{IA}}, \quad (5)$$

where $f_z$ is the frequency at which zero of the gain transfer function occurs.

In one or more embodiments, the $\beta_1(s)$ factor may be provided at the virtual ground as it may result in a higher rejection at dc by a gain factor of $|A_1(f_z)|$, as expressed in example Equation (6):

$$\frac{|A_{CL,OC}(f_{HP,fb})|}{|A_{CL,OC}(f_z)|} \approx \left|\frac{\beta_1(f_z)}{\beta_{IA}}\right| \quad (6)$$

However, the provision of the feedback at the virtual ground may result in a higher cut-off frequency, and the rejection at dc may become gain dependent.

In one or more embodiments, $f_{HP,fb}$ may be expressed as example Equation (7):

$$f_{HP,fb} = \frac{f_{HP}}{1 + |A_{OL,OC}(f_{HP})| \cdot \beta_{IA}}, \quad (7)$$

and $f_{HP}$ is determined by $|A_{OL}(s) \cdot \beta_1(s)| = 0$ dB.

Figure 5:
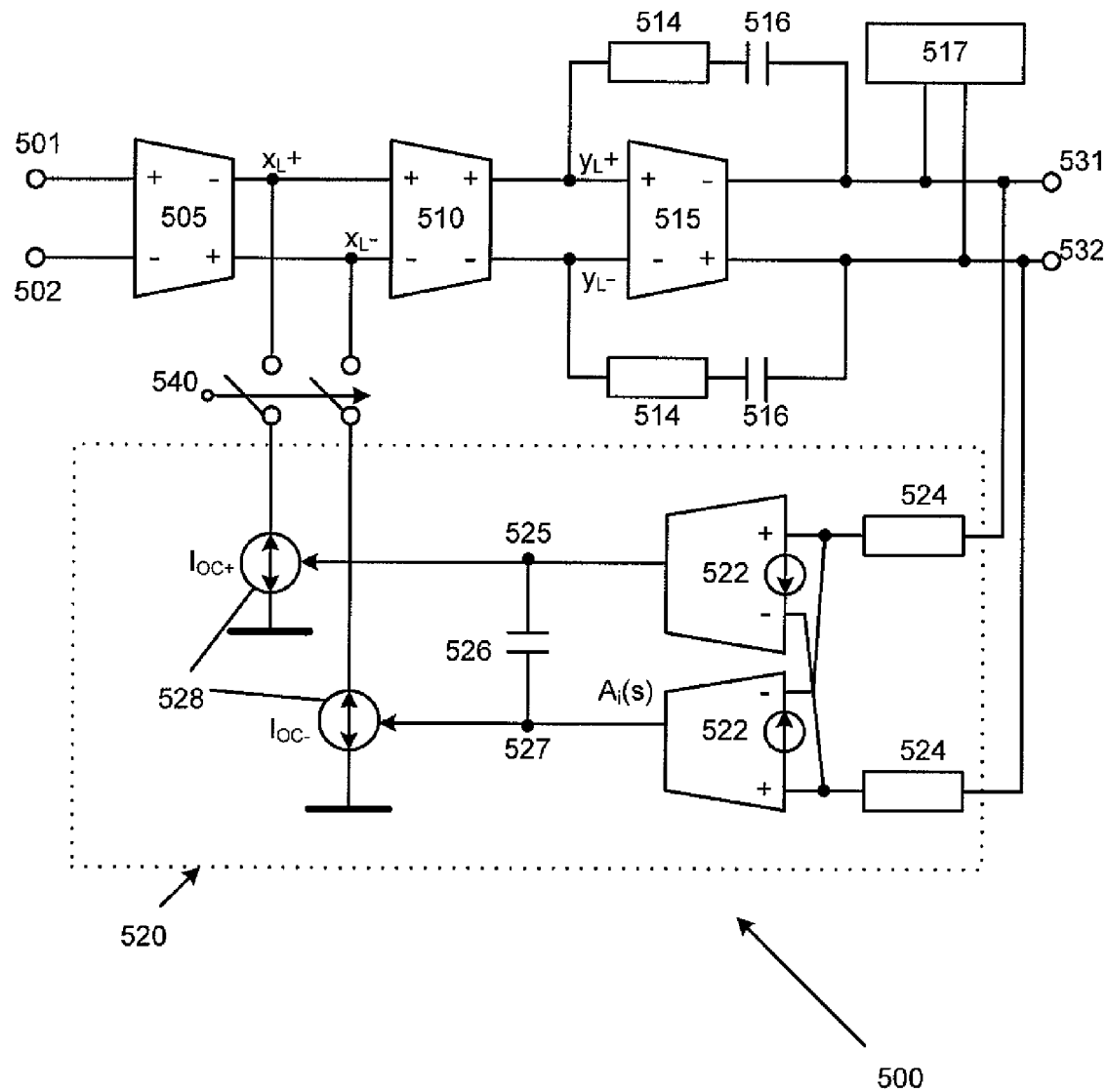
FIG. 5 shows the block schematic of an opamp with a built-in DOC in accordance with one or more embodiments of the present invention, where $A_1(s)$, $A_2(s)$, and $A_3(s)$ are the sub-amplifiers of the opamps, as referred to in FIG. 2, and $\beta_1(s)$ refers to the DOC.

FIG. 5 shows the block schematic of an opamp 500 with a built-in $\beta_1(s)$ 520, in accordance with one or more embodiments of the present invention, where $A_1(s)$ 505, $A_2(s)$ 510, and $A_3(s)$ 515 are the sub-amplifiers of the opamp 500, analogous to FIG. 2. Inputs $V_{inp}$ 501 and $V_{inn}$ 502 are the positive and negative input terminals, and $x_L$(+ and −) refers to the low-impedance node at the interface, analogous to FIG. 2. A switch 540 may be employed to control ON and OFF times of the DOC $\beta_1(s)$ 520. In one or more embodiments, frequency compensation by way of a capacitor $C_c$ 516 is provided in the feedback loop of $A_3(s)$ 515 to stabilize $A_3(s)$ 515, and to provide a dominant pole in the open-loop response. In one embodiment, resistor $R_c$ 514 may be provided to damp out the resonance. The input terminals through which the above feedback may be connected are $y_L$+ and $y_L$−. In one or more embodiments, the opamp 500 may include an output Common Mode Feedback (O-CMFB) circuit 517 to achieve the output common-mode voltage setting, and for dc-offset cancellation purposes. In one or more embodiments, the O-CMFB circuit 517 may contribute to a reduction in circuit size.

In one or more embodiments, front-end resistors $R_{oc}$ 524 in the DOC $\beta_1(s)$ 520 may interface the high swing output, $V_{outp}$ 531 and $V_{outn}$ 532, to two differential-input single-ended-output current amplifiers $A_i(s)$ 522. In one embodiment, the two $A_i(s)$ 522 amplifiers may differentially drive the capacitor $C_{oc}$ 526 and form a pseudo-differential gm–C (gm–transconductance) integrator. In one or more embodiments, this may avoid systematic dc-offset while offering internal common-mode rejection. In one or more embodiments, the low impedance inputs of the $A_i(s)$ 522 amplifiers may allow for the $R_{oc}$ 524 resistors to be cross-coupled between the two $A_i(s)$ 522 amplifiers for better matching.

In one or more embodiments, the output stage may be an inverter-based charge pump $I_{oc+}(I_{oc-})$ 528 that can source or sink current. In one or more embodiments, based on the charge pumps $I_{oc+}(I_{oc-})$ 528, the speed in cancelling the dynamic dc-offset may be doubled, and the output swing may be extended to almost rail-to-rail. Voltage levels $V_{oc+}(V_{oc-})$ 525 (527) are also shown in FIG. 5.

Figure 6:
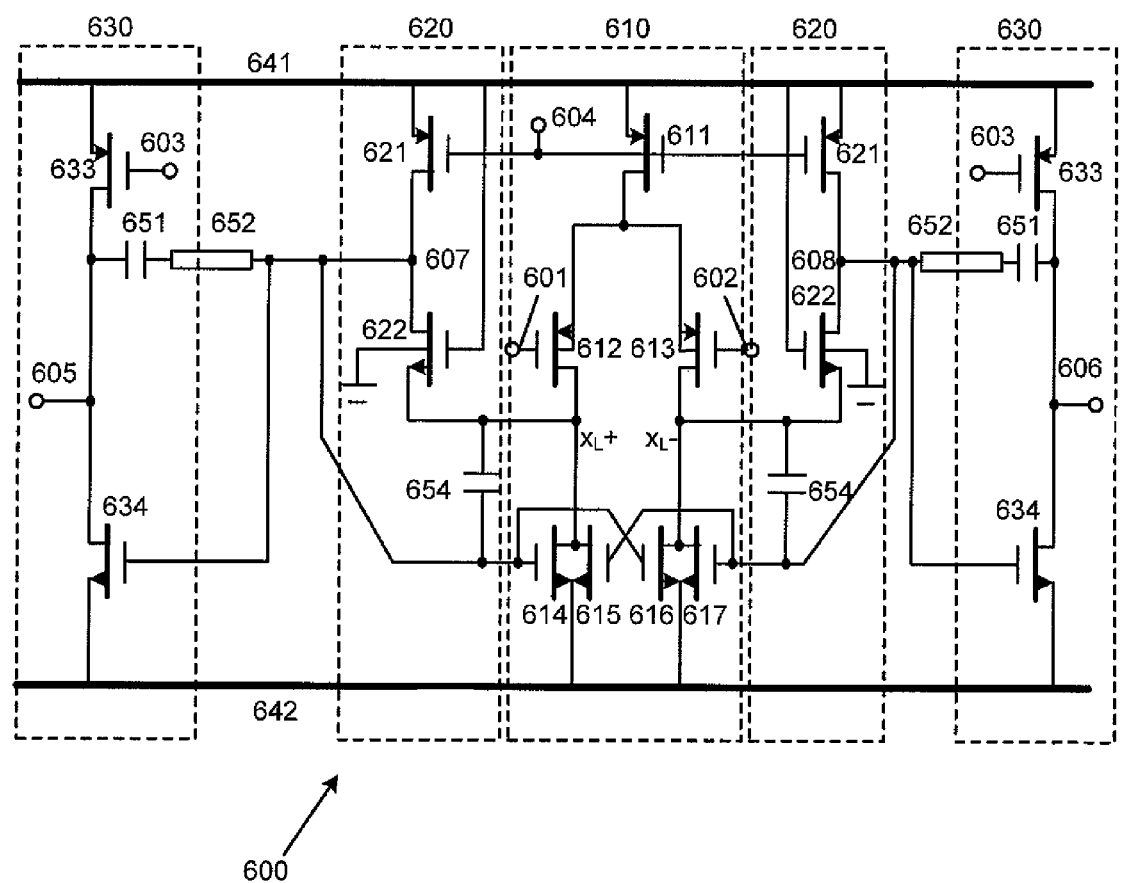
FIG. 6 shows the schematic of a differential opamp as an example of a transistor-level implementation, in accordance with one or more embodiments of the present invention.

FIG. 6 shows an exemplary transistor-level implementation of a differential opamp 600 in accordance with one or more embodiments of the present invention. The source potential levels are $V_{DD}$ 641 and $V_{SS}$ 642. The input terminals are $V_{inp}$ 601 and $V_{inn}$ 602, the output terminals are $V_{outp}$ 605 and $V_{outn}$ 606, the bias terminal is $V_{bias1}$ 604, and the CMFB voltage terminals are $V_{cmfb}$ 603. In one or more embodiments, the sub-amplifier $A_1(s)$ 610 may be implemented as a p-channel differential pair ($M_{b1}$ 611, $M_1$ 612 and $M_2$ 613) for a higher common-mode rejection ratio (CMRR) thereof. In one or more embodiments, $A_1(s)$ 610 may set the minimum $V_{DD}$ of the entire opamp 600, where $V_{DD}$ may be expressed as:

$$V_{DD} \geq |V_{T,p}| + 2V_{SDsat} + V_{DSsat}, \quad (8)$$

$V_{T,p}$ being the p-channel transistor threshold voltage, $V_{SDsat}$ being the source-drain saturation voltage, and $V_{DSsat}$ is the drain-source saturation voltage.

In one or more embodiments, a cross-coupled active load (transistors $M_{3A}$ 614, $M_{3B}$ 615, $M_{4A}$ 617, and $M_{4B}$ 616) may be employed for realizing a wideband n-channel folded-cascode intermediate stage. Such a cross-coupled load would dispel the need for additional CMFB circuitry that contributes to increased power consumption. $A_2(s)$ 620 may be a common gate amplifier formed with a common-source amplifier transistor pair (transistors $M_{b2}$ 621 and $M_5$ 622) and having a shunt-shunt feedback that lowers the input resistance $R_{x_L+}$ at the terminals ($x_L$+ and $x_L$−) between $A_1(s)$ 610 and $A_2(s)$ 620 as expressed in example Equation (9):

$$R_{x_L+} = \left(\frac{1}{g_{m5} + g_{m,5b}}\right)\left(1 + \frac{r_{o,b2}}{r_{o,1}\|r_{o,3A}\|r_{o,3B}\|r_{o,5}}\right) \cdot \left(\frac{1}{1 + (g_{m3A} - g_{m3B})r_{o,b2}}\right), \quad (9)$$

where $g_{m5}$ and $g_{m5b}$ are the transconductance and body transconductance of transistor $M_5$ 622 respectively, $r_{o,1}$, $r_{o,b2}$, $R_{o,3A}$, $r_{o,3B}$, and $r_{o,5}$ are the output resistances of $M_1$ 612, $M_{b2}$ 621, $M_{3A}$ 614, $M_{3B}$ 615, and $M_5$ 622 respectively, and $f_{m3A}$ and $g_{m3B}$ are the transconductances of $M_{3A}$ 614 and $M_{3B}$ 615 respectively.

In one or more embodiments, the loop gain $(g_{m3A}-g_{m3B})$ $r_{o,b2}$ vanishes when $g_{m3A}=g_{m3B}$, but suppresses $R_{x_L+}$ for common-mode signals effectively through the $(g_{m3A}+g_{m3B})r_{o,b2}$ term.

In one or more embodiments, the gates of the transistors $M_{3A}$ 614, $M_{4B}$ 616, and $M_{4A}$ 617, $M_{3B}$ 615 are connected to the output terminals ($y_L$+607 and $y_L$−608) of the sub-amplifier stage $A_2(s)$ 620 such that the feedback connection causes the output resistance $R_{y_L+}$ of $A_2(s)$ 620 to be lowered due to another loop gain as per example Equation (10):

$$R_{y_L+} = \frac{r_{o,b2}}{1 + \frac{(g_{m3A} - g_{m3B})(g_{m5} + g_{m5b}) \cdot r_{o,1} r_{o,b2}}{(g_{m5} + g_{m5b})r_{o,1} + 1}}, \quad (10)$$

In one or more embodiments, for differential signals at node $y_L+$, the transconductances seen at the gates of transistors $M_{3A}$ 614 and $M_{4A}$ 617 are canceled by transconductances of transistors $M_{3b}$ 615 and $M_{4B}$ 616 when $g_{m3A}=g_{m3B}$. Here $R_{y_L+}$ is dominated by $r_{o,b2}$. For a common mode signal, Equation (10), now slightly modified, still represents the output resistance $R_{y_L+}$, $R_{y_L+}$ being limited by $$\frac{1}{(g_{m3A} + g_{m3B})}.$$

As this is a relatively low impedance, no additional CMFB circuitry is required at the input stage, and the CMFB of the opamp 600 may be closed solely at the output stage, i.e., at transistors $M_7$ 633. Transistors $M_7$ 633 and $M_9$ 634 form a pair as part of the sub-amplifier stage $A_3(s)$ 630.

In one or more embodiments, a standard Miller compensation scheme in the form of compensation capacitor $C_c$ 651 in series with compensation resistance $R_c$ 652 may be connected between the output nodes of $A_3(s)$ 630 and the terminals $y_L+$ and $y_L-$ as shown in FIG. 6. In one or more embodiments, an approximate pole-zero cancelation may be accomplished through a proper choice of $R_c$ 652 upon analysis of the amplifier transfer function, thereby enhancing the phase margin. In one or more embodiments, the phase margin may also be optimized by adding a feed forward capacitor $C_{cp}$ 654 to $A_2(s)$ 620.

Figure 7:
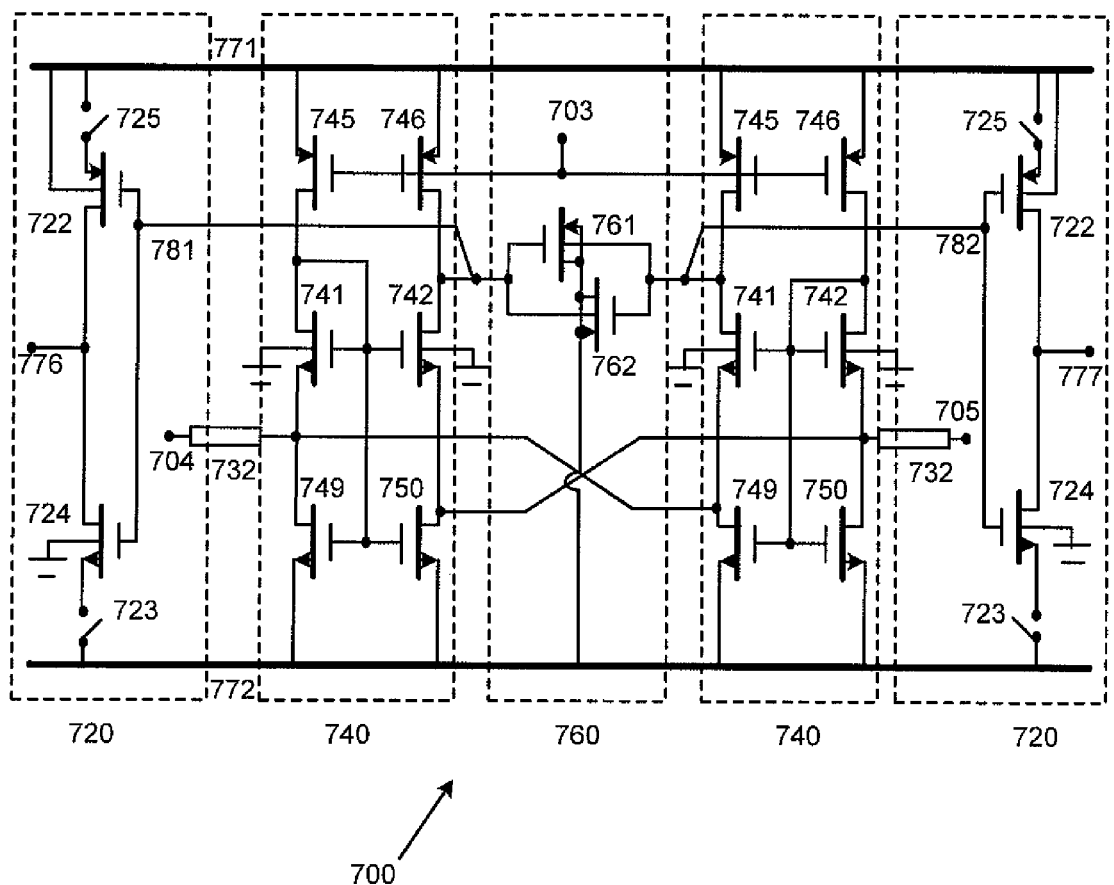
FIG. 7 shows the schematic of a DOC to be used in the feedback loop of the differential opamp of FIG. 6(a) as an example of a transistor-level implementation, in accordance with one or more embodiments of the present invention.

FIG. 7 shows a transistor-level implementation of a DOC 700 to be used in the feedback loop of the opamp 600 of FIG. 6, in accordance with one or more embodiments of the present invention. Again, the source potential levels are $V_{DD}$ 771 and $V_{SS}$ 772, the terminals of the low-impedance node are $x_L+$ 776 and $x_L-$ 777, and the output terminals $V_{outp}$ 704 and $v_{outn}$ 705 are the same as output terminals $V_{outp}$ 605 and $V_{outn}$ 606 in FIG. 6. In one or more embodiments, a self-biased sub-threshold cascode current mirror in the form of transistors $M_{oc5}$ 749 and $M_{oc6}$ 750 may be biased in the saturation region to absorb the dc current from output terminals $V_{outp}$ 704 and $V_{outn}$ 705. Transistors $M_{oc5}$ 749, $M_{oc6}$ 750, $M_{oc9}$ 741, $M_{oc10}$ 742, $M_{oc13}$ 745, and $M_{oc14}$ 746 for the sub-amplifier stage $A_f(s)$ 740, analogous to $A_f(s)$ 522 in FIG. 5. The bias terminal is $V_{bias2}$ 703.

In one or more embodiments, utilizing long channel length devices for $M_{oc13}$ 745, and $M_{oc14}$ 746 to deliver ultra-small biasing currents, coupled with modification of threshold voltages of $M_{oc9}$ 741 and $M_{oc10}$ 742 due to body effects thereof, may result in $M_{oc9}$ 741 and $M_{oc10}$ 742 being operated in the sub-threshold region, where the transistors offer high intrinsic gain that is independent of device geometry.

In one or more embodiments, the DOC 700 may also include a sink/source exchangeable charge pump $I_{oc+}(I_{oc-})$ 720 that includes two transistors $M_{oc1}$ 722 and $M_{oc2}$ 724. The aforementioned charge pump $I_{oc+}(I_{oc-})$ 720 may be adopted as the output stage. In one or more embodiments, the charge pump $I_{oc+}(I_{oc-})$ 720 may include switches 723 and 725 to control ON and OFF times. The switching state of switch 725 may be a complement of the switching state of switch 723. In one or more embodiments, the charge pump $I_{oc+}(I_{oc-})$ 720 may not only relax the linearity requirement of $A_1(s)$ 740 of FIG. 6 but also may reduce the signal swing associated with the integration capacitor $C_{oc}$ 760. In one or more embodiments, the integration capacitor $C_{oc}$ 760 may be implemented with a nonlinear anti-parallel compensated depletion mode-MOS capacitor (transistors $M_{oc17}$ 761 and $M_{oc8}$ 762, as shown in FIG. 7). In one or more embodiments, resistors $R_{oc}$ 732 may be cross-coupled between $A_f(s)$ 740. Voltages $V_{oc+}$ ($V_{oc-}$) 781 (782) are voltage levels at $I_{oc+}(I_{oc-})$ 720 as shown in FIG. 7.

In one or more embodiments, the s-domain transfer function of the DOC 700 standalone circuit may be expressed as example Equation (11):

$$\frac{I_{oc+}(s) - I_{oc-}(s)}{V_{outp}(s) - V_{outn}(s)} = 2\frac{gm_{oc}}{R_{oc}} \frac{A_{i,dc} r_{o,Ai}}{(sr_{o,Ai}C_{oc} + 1)}, \quad (11)$$

where $A_{i,dc}$ and $r_{o,Ai}$ are the current-to-current dc gain and output resistance of $A_f(s)$ 740 respectively, $gm_{oc}$ is the transconductance of $I_{oc+}$ (either $M_{oc1}$ 722 or $M_{oc2}$ 724). In one or more embodiments, controlling $C_{oc}$ 760 may minimize the corner frequency without disturbing the gain, while the other parameters are designed in parallel. In one or more embodiments, $R_{oc}$ 732 may dominate the DOC 700 induced noise.

In one or more embodiments, the intrinsic dc-offset of the DOC 700 after being referred to the input of the opamp 600 may be lowered by $A_f(s)$, and the residual may become part of the dc-offset of the opamp 600 that is multiplied by $$\left(1 + \frac{R_{fb}}{R_{ff}}\right)$$

(see FIG. 3) at the output of the PGA including the opamp 600 and the DOC 700. In one or more embodiments, as $A_1(s)$ 610 may be a differential pair that offers a dc gain close to 25 dB, dc-offset induced by the DOC 700 may be negligible compared to the dc-offset induced by the opamp 600.

In one or more embodiments, switched resistor arrays may be connected in the feedback loops of at least one of the three stages of the PGA for tuning loop gains thereof. In one or more embodiments, there may be N identical high-pass PGA stages in a cascade of PGAs described above.

Advantages of one or more embodiments of the present invention may include one or more of the following.

In one or more embodiments of the present invention, the chip area for realizing the large time constant in dc-offset extraction is very small.

In one or more embodiments of the present invention, the inside-opamp DOC provides a large time-constant integrator around the PGA to eliminate the dc offset and provides pole switchability to shorten the receiver setting time in case of dc-offset transients.

In one or more embodiments of the present invention, application of the DOC feedback at node $x_L$, instead of the commonly employed virtual ground, may lower the noise and the DOC-induced non-linearity.

In one or more embodiments of the present invention, chip area savings may be achieved by way of the shift in the high-pass (low-pass) pole due to the negative feedback, thereby leading to bandwidth extension.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An amplifier circuit comprising:
   a transconductance amplifier at an input side of the amplifier circuit;
   a transimpedance amplifier connected to an output of the transconductance amplifier, the transconductance amplifier and the transimpedance amplifier forming a low-impedance node at an interface thereof;
   a voltage amplifier having a gain greater than 1 connected to an output of the transimpedance amplifier; and
   a feedback circuit connected between an output of the voltage amplifier and the low-impedance node between the transconductance amplifier and the transimpedance amplifier,
   wherein the transconductance amplifier, the transimpedance amplifier, and the voltage amplifier form a main amplifier stage, and
   wherein the feedback circuit senses an imbalance in an output of the main amplifier stage, whereby a correction signal is integrated and negatively fed back to the low-impedance node between the transconductance amplifier and the transimpedance amplifier.

2. The amplifier circuit according to claim 1, wherein the amplifier circuit is an opamp.

3. The amplifier circuit according to claim 1, wherein a forward path of the main amplifier stage is closed by a feedback resistor.

4. The amplifier circuit according to claim 3, wherein a switched resistor array is connected in parallel to the feedback resistor in order to tune a gain range.

5. The amplifier circuit according to claim 1, wherein the transconductance amplifier is a wideband amplifier.

6. The amplifier circuit according to claim 1, wherein the main amplifier stage is an inverting amplifier.

7. The amplifier circuit according to claim 1, wherein the main amplifier stage and the feedback circuit are provided as part of an operational amplifier.

8. The amplifier circuit according to claim 1, wherein a feedback circuit is provided at every amplifier stage.

9. The amplifier circuit according to claim 1, wherein feedback is provided at a virtual ground instead of the low-impedance node.

10. The amplifier circuit according to claim 1, wherein the voltage amplifier comprises a capacitor in series with a resistor as a feedback loop for frequency compensation.

11. The amplifier circuit according to claim 1, wherein a common mode feedback circuit is connected across output terminals of the voltage amplifier.

12. The amplifier circuit according to claim 11, wherein the feedback circuit comprises differential-input single-ended-output current amplifiers with low-impedance inputs differentially driving an integration capacitor to form an integrator.

13. The amplifier circuit according to claim 11, wherein the feedback circuit comprises a switch configured to control an operation thereof.

14. The amplifier circuit according to claim 11, wherein the transconductance amplifier is a p-channel differential pair.

15. The amplifier circuit according to claim 11, wherein the transimpedance amplifier is a common-gate amplifier.

16. The amplifier circuit according to claim 12, wherein the feedback circuit further comprises an inverter-based charge pump configured to one of source and sink current at an output thereof.

17. The amplifier circuit according to claim 16, wherein the inverter-based charge pump reduces a signal swing associated with the integration capacitor connected across outputs of the differential-input single-ended-output current amplifiers.

18. The amplifier circuit according to claim 17, wherein the integration capacitor is an anti-parallel-compensated depletion-mode MOS capacitor.

19. The amplifier circuit according to claim 14, wherein the transconductance amplifier comprises a cross-coupled active transistor load for enabling the common mode feedback circuit to be closed solely at output terminals of the voltage amplifier.

20. The amplifier circuit according to claim 15, wherein the common-gate amplifier comprises a shunt-shunt feedback to lower an input resistance thereof.

21. A receiver for use in wireless local area networks, the receiver comprising:
   a low noise amplifier;
   a first mixer that receives as an input a first reference local oscillator frequency in a Radio Frequency (RF) range;
   a channel selection filter; and
   a PGA, the PGA comprising:
      a transconductance amplifier at an input side thereof;
      a transimpedance amplifier connected to an output of the transconductance amplifier, the transconductance amplifier and the transimpedance amplifier forming a low-impedance node at an interface thereof;
      a voltage amplifier having gain a greater than 1 connected to an output of the transimpedance amplifier; and
      a feedback circuit connected between an output of the voltage amplifier and the low-impedance node between the transconductance amplifier and the transimpedance amplifier,
      wherein the transconductance amplifier, the transimpedance amplifier, and the voltage amplifier form a main amplifier stage, and
      wherein the feedback circuit senses an imbalance in an output of the main amplifier stage, whereby a correction signal is integrated and negatively fed back to the low-impedance node between the transconductance amplifier and the transimpedance amplifier.

22. The receiver according to claim 21, wherein the PGA further comprises a switched resistor array in a forward path of the main amplifier stage.

23. The receiver according to claim 21, the receiver further comprising:
   a second mixer that receives as an input a second reference local oscillator frequency in an Intermediate Frequency (IF) range.

24. The receiver according to claim 21, wherein the receiver is a zero IF receiver.

25. The receiver according to claim 21, wherein the channel selection filter is a high-gain filter.

26. A method for shifting a high-pass pole to a lower/higher frequency in a PGA, the method comprising:
   connecting an output of a transconductance amplifier to an input of a transimpedance amplifier to form a low impedance node at an interface thereof;
   connecting a voltage amplifier having a gain greater than 1 to an output of the transimpedance amplifier;
   connecting a feedback circuit between an output of the voltage amplifier and the low-impedance node between the transconductance amplifier and the transimpedance amplifier, wherein the transconductance amplifier, the transimpedance amplifier, and the voltage amplifier form a main amplifier stage; and sensing an imbalance in an output of the main amplifier stage using the feedback circuit, whereby a correction signal is integrated and negatively fed back to the low-- impedance node between the transconductance amplifier and the transimpedance amplifier.

27. The receiver according to claim 23, wherein the RF and IF reference local oscillator frequencies are synthesized by a same frequency source.

\* \* \* \* \*